US009406250B2

(12) United States Patent
Chen et al.

(10) Patent No.: US 9,406,250 B2
(45) Date of Patent: Aug. 2, 2016

(54) DISPLAY PANEL AND METHOD OF DETECTING DEFECTS THEREOF

(71) Applicant: AU Optronics Corp., Hsin-Chu (TW)

(72) Inventors: Po-Ya Chen, Hsin-Chu (TW); Meng-Che Tsai, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 709 days.

(21) Appl. No.: 13/831,527

(22) Filed: Mar. 14, 2013

(65) Prior Publication Data

US 2014/0139255 A1 May 22, 2014

(30) Foreign Application Priority Data

Nov. 16, 2012 (TW) ............................. 101142860 A

(51) Int. Cl.
*G01R 31/26* (2014.01)
*G09G 3/00* (2006.01)

(52) U.S. Cl.
CPC ..................................... *G09G 3/006* (2013.01)

(58) Field of Classification Search
None
See application file for complete search history.

(56) References Cited

U.S. PATENT DOCUMENTS

| | | | | |
|---|---|---|---|---|
| 4,995,703 A * | 2/1991 | Noguchi | G02F 1/13624 | 345/103 |
| 5,260,818 A * | 11/1993 | Wu | G02F 1/13624 | 349/144 |
| 5,504,348 A * | 4/1996 | Yoshida | G02F 1/136204 | 257/363 |
| 5,754,678 A * | 5/1998 | Hawthorne | G06T 7/0004 | 324/760.01 |
| 6,072,554 A * | 6/2000 | Sato | G02F 1/134363 | 349/138 |
| 6,493,047 B2 * | 12/2002 | Ha | G02F 1/136204 | 257/360 |
| 6,606,141 B2 * | 8/2003 | Takasugi | G02F 1/1362 | 349/139 |
| 6,822,715 B2 * | 11/2004 | Miyachi | G02F 1/133707 | 349/129 |
| 7,057,677 B2 * | 6/2006 | Zhang | G02F 1/13454 | 257/E27.111 |
| 7,061,553 B2 * | 6/2006 | Taguchi | G02F 1/136213 | 349/141 |
| 7,084,947 B2 * | 8/2006 | Miyachi | G02F 1/133707 | 349/129 |
| 7,164,402 B2 * | 1/2007 | Yanagawa | G02F 1/134363 | 345/87 |
| 7,196,746 B2 * | 3/2007 | Yang | G02F 1/136213 | 349/39 |

(Continued)

FOREIGN PATENT DOCUMENTS

| | | |
|---|---|---|
| CN | 1800925 A | 7/2006 |
| CN | 1825176 A | 8/2006 |

(Continued)

*Primary Examiner* — Jermele M Hollington
*Assistant Examiner* — Suresh K Rajaputra
(74) *Attorney, Agent, or Firm* — Winston Hsu; Scott Margo

(57) ABSTRACT

A display panel includes a first substrate, a plurality of pixel units, a plurality of first signal lines, a first testing line and a second testing line. The first signal lines are disposed on a peripheral area and electrically connected to corresponding pixel units. The first signal lines include a plurality of first sets of signal lines and a plurality of second sets of signal lines alternatively arranged. The first and second sets of signal lines are formed on different layers. The first testing line is electrically connected to the first sets of signal lines. The second testing line is electrically connected to the second sets of signal lines.

21 Claims, 9 Drawing Sheets

(56) References Cited

U.S. PATENT DOCUMENTS

| | | | | | |
|---|---|---|---|---|---|
| 7,342,579 | B2 * | 3/2008 | Chou | G02F 1/136204 | 345/214 |
| 7,375,724 | B2 * | 5/2008 | Jiang | G02F 1/136204 | 345/204 |
| 7,423,447 | B2 * | 9/2008 | Yu | G01R 31/3181 | 324/760.01 |
| 7,532,265 | B2 * | 5/2009 | Tsai | G02F 1/13454 | 257/443 |
| 7,551,169 | B2 * | 6/2009 | Yanagawa | G02F 1/134363 | 345/204 |
| 7,564,525 | B2 * | 7/2009 | Miyachi | G02F 1/133707 | 349/129 |
| 7,576,556 | B1 * | 8/2009 | Huang | G09G 3/006 | 324/760.01 |
| 7,589,703 | B2 * | 9/2009 | Su | G09G 3/3648 | 345/103 |
| 7,619,436 | B2 * | 11/2009 | Kwak | H01L 22/34 | 324/760.02 |
| 7,626,647 | B2 * | 12/2009 | Ker | H01L 29/7436 | 257/E21.388 |
| 7,649,604 | B2 * | 1/2010 | Paik | G02F 1/134363 | 349/141 |
| 7,738,223 | B2 * | 6/2010 | Ker | G02F 1/136204 | 349/40 |
| 7,843,208 | B2 * | 11/2010 | Kwak | H01L 22/34 | 324/760.02 |
| 7,995,011 | B2 * | 8/2011 | Jeong | G09G 3/006 | 315/169.3 |
| 8,009,131 | B2 * | 8/2011 | Yu | G09G 3/006 | 345/87 |
| 8,207,925 | B2 * | 6/2012 | Masui | G09G 3/3688 | 345/100 |
| 8,427,596 | B2 * | 4/2013 | Ma | G02F 1/136286 | 345/208 |
| 8,502,766 | B2 * | 8/2013 | Jiang | G09G 3/006 | 324/527 |
| 8,508,111 | B1 * | 8/2013 | Xi | H01L 22/14 | 313/238 |
| 8,730,417 | B2 * | 5/2014 | Cho | G02F 1/1309 | 349/33 |
| 8,817,217 | B2 * | 8/2014 | Kwak | G02F 1/134363 | 349/149 |
| 9,052,549 | B2 * | 6/2015 | Lee | G02F 1/133788 | |
| 2005/0168423 | A1 * | 8/2005 | Hirata | G09G 3/2003 | 345/88 |
| 2005/0179037 | A1 * | 8/2005 | Fujita | G09G 3/3648 | 257/72 |
| 2006/0139551 | A1 * | 6/2006 | Kimura | G02F 1/1345 | 349/149 |
| 2007/0046316 | A1 * | 3/2007 | Uei | G09G 3/006 | 324/760.01 |
| 2007/0200993 | A1 * | 8/2007 | Aramatsu | G02F 1/136259 | 349/149 |
| 2007/0229420 | A1 * | 10/2007 | Hwang | G09G 3/006 | 345/87 |
| 2008/0001619 | A1 * | 1/2008 | Igarashi | H01J 9/42 | 324/756.01 |
| 2008/0024690 | A1 * | 1/2008 | Hirakata | G02F 1/136259 | 349/54 |
| 2008/0062347 | A1 * | 3/2008 | Peng | G02F 1/136259 | 349/54 |
| 2009/0002013 | A1 * | 1/2009 | Lai | G09G 3/006 | 324/760.01 |
| 2010/0193222 | A1 * | 8/2010 | Peng | G02F 1/136259 | 174/250 |
| 2011/0095290 | A1 * | 4/2011 | Koo | G02F 1/1309 | 257/48 |
| 2011/0141376 | A1 * | 6/2011 | Tsubata | G02F 1/136213 | 348/731 |
| 2012/0050658 | A1 * | 3/2012 | Cheng | G02F 1/136259 | 349/139 |

FOREIGN PATENT DOCUMENTS

| | | |
|---|---|---|
| CN | 101969043 A | 2/2011 |
| TW | I232946 | 5/2005 |
| TW | I353469 | 12/2011 |

* cited by examiner

DISPLAY PANEL AND METHOD OF DETECTING DEFECTS THEREOF

BACKGROUND OF THE INVENTION

1. Field of the Invention

The present invention relates to a display panel and a method of detecting defects of a display panel.

2. Description of the Prior Art

Due to their slim shapes, low power dissipation and low radiation, liquid crystal displays (LCDs) are widely applied in mobile electronic devices such as notebooks, monitors, and PDAs (personal digital assistants). For reducing the manufacturing cost and improving yield rate of displays, the manufacturer would be likely to detect defects on the displays before shipping them, e.g. detect whether the displays have bright spots and dark spots.

However in the related art defect detecting method, if adjacent data lines electrically connected to the pixels are short circuited, damaged pixels electrically connected to the short circuited data lines may still emit light. Therefore, the related art method can not effectively detect all of the damaged pixels in the display, resulting in a reduced yield rate.

SUMMARY OF THE INVENTION

An embodiment of the present invention relates to a display panel. The display panel comprises a first substrate, a plurality of pixel units, a plurality of first signal lines, a first testing line and a second testing line. The first substrate has a display area and a peripheral area. The plurality of pixel units is arranged on the display area in an array. The plurality of first signal lines are disposed on the peripheral area and electrically connected to corresponding pixel units. The plurality of first signal lines comprise a plurality of first sets of sub-signal lines and a plurality of second sets of sub-signal lines alternatively arranged. Each first set of sub-signal lines have a first sub-signal line and a second sub-signal line. Each second set of sub-signal lines have a first sub-signal line and a second sub-signal line. The first sub-signal lines of the first sets of sub-signal lines and of the second sets of sub-signal lines and second sub-signal lines of the first sets of sub-signal lines and of the second sets of sub-signal lines are formed on different layers. The first testing line is electrically connected to the first and second sub-signal lines of the first sets of sub-signal lines. The second testing line is electrically connected to the first and second sub-signal lines of the second sets of sub-signal lines.

Another embodiment of the present invention relates to a method of detecting defects of a display panel. The display panel comprises a first substrate, a plurality of pixel units, a plurality of first signal lines, a first testing line and a second testing line. The first substrate has a display area and a peripheral area. The plurality of pixel units is arranged on the display area in an array. The plurality of first signal lines are disposed on the peripheral area and are electrically connected to corresponding pixel units. The plurality of first signal lines comprise a plurality of first sets of sub-signal lines and a plurality of second sets of sub-signal lines alternatively arranged. Each first set of sub-signal lines have a first sub-signal line and a second sub-signal line. Each second set of sub-signal lines have a first sub-signal line and a second sub-signal line. The first sub-signal lines of the first sets of sub-signal lines and of the second sets of sub-signal lines and second sub-signal lines of the first sets of sub-signal lines and of the second sets of sub-signal lines are formed on different layers. The first testing line is electrically connected to the first and second sub-signal lines of the first sets of sub-signal lines. The second testing line is electrically connected to the first and second sub-signal lines of the second sets of sub-signal lines. The method comprises lighting up pixel units electrically connected to the first sets of sub-signal lines to detect whether the pixel units electrically connected to the first sets of sub-signal lines have defects, and lighting up pixel units electrically connected to the second sets of sub-signal lines to detect whether the pixel units electrically connected to the second sets of sub-signal lines have defects.

Another embodiment of the present invention relates to a display panel. The display panel comprises a first substrate, a plurality of pixel units, a plurality of first signal lines, a driving element, a first testing line, a second testing line and a slit. The first substrate has a display area and a peripheral area. The plurality of pixel units is arranged on the display area in an array. The plurality of first signal lines are disposed on the peripheral area and are electrically connected to corresponding pixel units. The plurality of first signal lines comprise a plurality of first sets of sub-signal lines and a plurality of second sets of sub-signal lines alternatively arranged. Each first set of sub-signal lines have a first sub-signal line and a second sub-signal line, each second set of sub-signal lines have a first sub-signal line and a second sub-signal line. The first sub-signal lines of the first sets of sub-signal lines and of the second sets of sub-signal lines and second sub-signal lines of the first sets of sub-signal lines and of the second sets of sub-signal lines are formed on different layers. The driving element is disposed on the first signal lines and is electrically connected to the first signal lines. The first testing line is disposed corresponding to the first and second sub-signal lines of the first sets of sub-signal lines. The second testing line is disposed corresponding to the first and second sub-signal lines of the second sets of sub-signal lines. The slit is formed between the first testing line and the first sets of sub-signal lines, and between the second testing line and the second sets of sub-signal lines, for isolating the first testing line from the first sets of sub-signal lines, and isolating the second testing line from the second sets of sub-signal lines.

These and other objectives of the present invention will no doubt become obvious to those of ordinary skill in the art after reading the following detailed description of the preferred embodiment that is illustrated in the various figures and drawings.

DETAILED DESCRIPTION

Some phrases are referred to specific elements in the present specification and claims, please notice that the manufacturer might use different terms to refer to the same elements. However, the definition between elements is based on their functions instead of their names. Further, in the present specification and claims, the term "comprising" is open type and should not be viewed as the term "consisted of." Besides, the term "electrically couple" can be referred to either directly connecting or indirectly connecting between elements.

The embodiments and figures are provided as follows in order to illustrate the present invention in detail, but please notice that the claimed scope of the present invention is not limited by the provided embodiments and figures.

Figure 1:
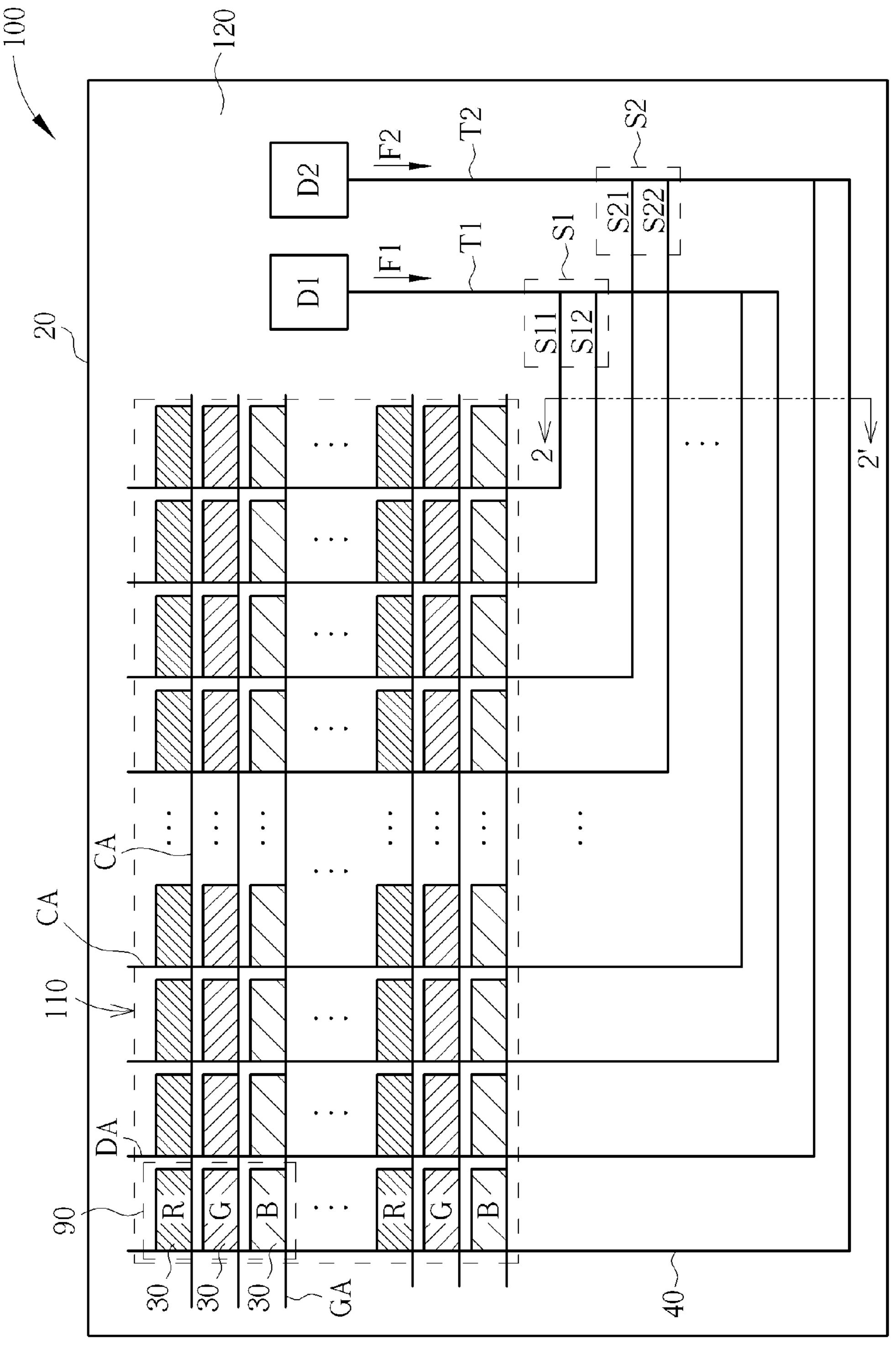
FIG. 1 shows a display panel according to the first embodiment of the present invention.

Please refer to FIG. 1, which shows a display panel 100 according to the first embodiment of the present invention. As shown in FIG. 1, the display panel comprises a first substrate 20, a plurality of display units 90, a plurality of first signal lines 40, a plurality of pixel control lines CA and testing lines T1 and T2. Each display unit 90 comprises a plurality of pixel units 30. The first substrate 20 has a display area 110 and a peripheral area 120. The peripheral device 120 surrounds the display area 110. The display area 110 is a part of the display panel 100 for displaying images. The peripheral device 120 is the part of the display panel 100 other than the display area 110 and is the area inside the frame of the display panel 100 for disposing circuitries electrically connected to the plurality of pixel units 30. The plurality of pixel units 30 are arranged on the first substrate 20 of the display area 110 in an array or a matrix structure. The pixel control lines CA comprise a plurality of data lines DA and a plurality of gate lines GA configured in the display area 110. The pixel units 30 are electrically connected to the pixel control lines CA. Each pixel unit 30 can be a red, green or blue sub-pixel, but is not limit to these three primary colors. Each pixel unit 30 can also be a cyanine, yellow, magenta or white sub-pixel, for example. Besides, the sub-pixels in the same row or column can be sub-pixels of the same color, and are electrically connected to the same gate line or data line. The sub-pixels in the same row or column are electrically connected to the same sub-signal line. And three sub-pixels marked with R, G and B can form a display unit.

Figure 2:
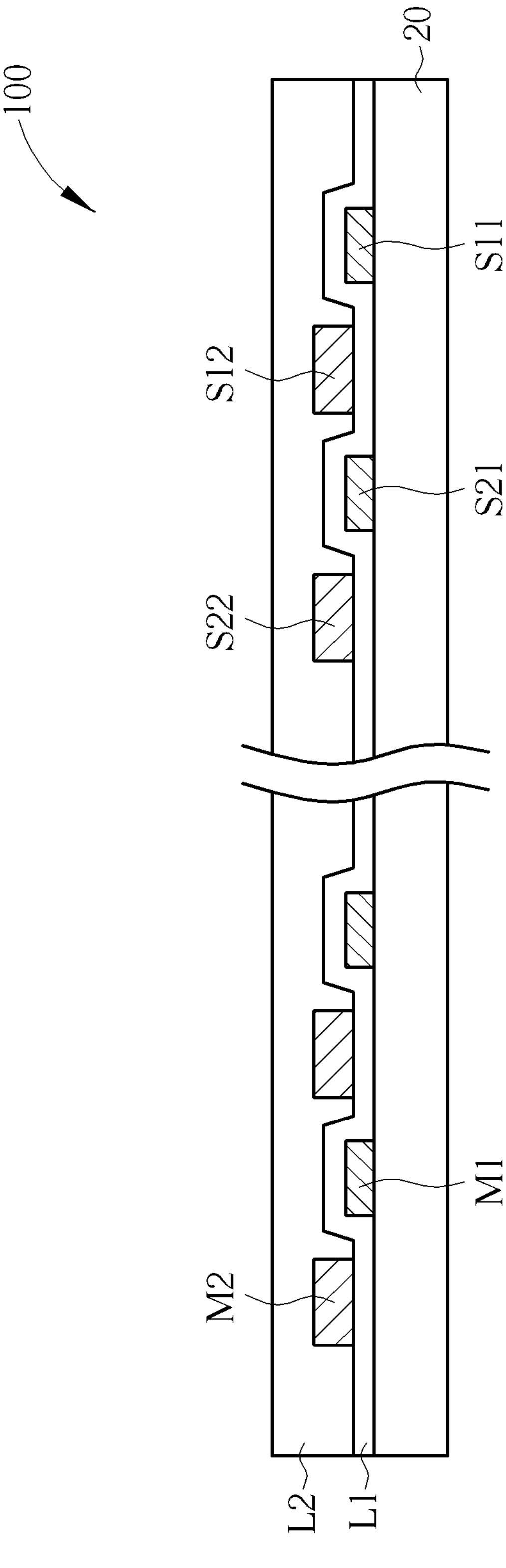
FIG. 2 shows a cross sectional view of the display panel along the section line in FIG. 1.

Please refer to both FIGS. 1 and 2. FIG. 2 shows a cross sectional view of the display panel 100 along the section line 2-2' in FIG. 1. The plurality of first signal lines 40 are disposed on the peripheral area 120 and electrically connected to corresponding pixel units 30. The plurality of first signal lines 40 comprise a plurality of first sets of sub-signal lines S1 and a plurality of second sets of sub-signal lines S2 alternatively arranged. Each first set of sub-signal lines S1 has a first sub-signal line S11 and a second sub-signal line S12. Each second set of sub-signal lines S2 has a first sub-signal line S21 and a second sub-signal line S22. The first sub-signal lines S11 and the second sub-signal lines S12 are formed in the peripheral area 120 and on different layers. That is, the first sub-signal lines S11 and the second sub-signal lines S12 are disposed on different conducting layers, e.g. the first sub-signal lines S11 are formed on the first conducting layer M1, and the second sub-signal lines S12 are formed on the second conducting layer M2. Similarly, the first sub-signal lines S21 and the second sub-signal lines S22 are formed on different conducting layers.

The first dielectric layer L1 is formed on the first substrate 20, and formed between the first conducting layer M1 and the second conducting layer M2. For example, the first dielectric layer L1 overlays the first sub-signal lines S11 and S21 on the first conducting layer M1, and the second sub-signal lines S21 and S22 on the second conducting layer M2 are formed on the first dielectric layer L1. The second dielectric layer L2 overlays the second sub-signal lines S21 and S22 on the second conducting layer M2. The testing line T1 is electrically connected to the first sub-signal lines S11 and the second sub-signal lines S12 of the first sets of sub-signal lines S1. The testing line T2 is electrically connected to the first sub-signal lines S21 and the second sub-signal lines S22 of the second sets of sub-signal lines S2. The testing lines T1 and T2 are electrically connected to the testing pads D1 and D2 respectively, for providing the pixel units 30 with signals transmitted from the testing pads D1 and D2. In the display panel 100, the first sub-signal line S11, the second sub-signal line S12, the first sub-signal line S21 and the second sub-signal line S22 can be arranged in sequence.

Figure 3:
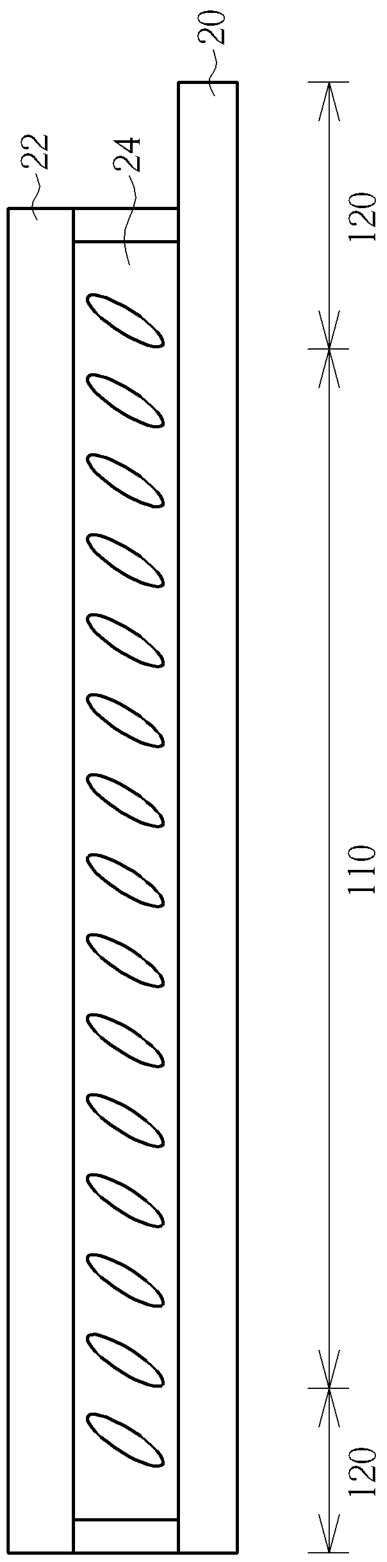
FIG. 3 shows a structure of the display panel in FIG. 1.

Please refer to FIG. 3, which shows a structure of the display panel 100 in FIG. 1. The display panel 100 can be a liquid crystal display (LCD) panel, an organic light emitting diode (OLED) display panel, a light emitting diode (LED) display panel, an electrophoresis display panel, an electrowetting display panel or a field emitting display panel, and so on, but not limited thereto. In addition to the first substrate 20, the display panel 100 can further comprises a second substrate 22 and a display medium 24. Taking the LCD for example, the previously mentioned pixel units 30 and the first signal lines 40 can be disposed on the first substrate 20 of an LCD panel, to compose an active element matrix substrate. A color filter layer and a black matrix can be disposed on the inner surface of the second substrate 22 or the first substrate 20 to form a color filter substrate. The display medium 24 can be various types of liquid crystal layer so as to form a required LCD panel. Some detailed parts will not be further described because they can be equivalently modified by one skilled in the art.

Figure 4:
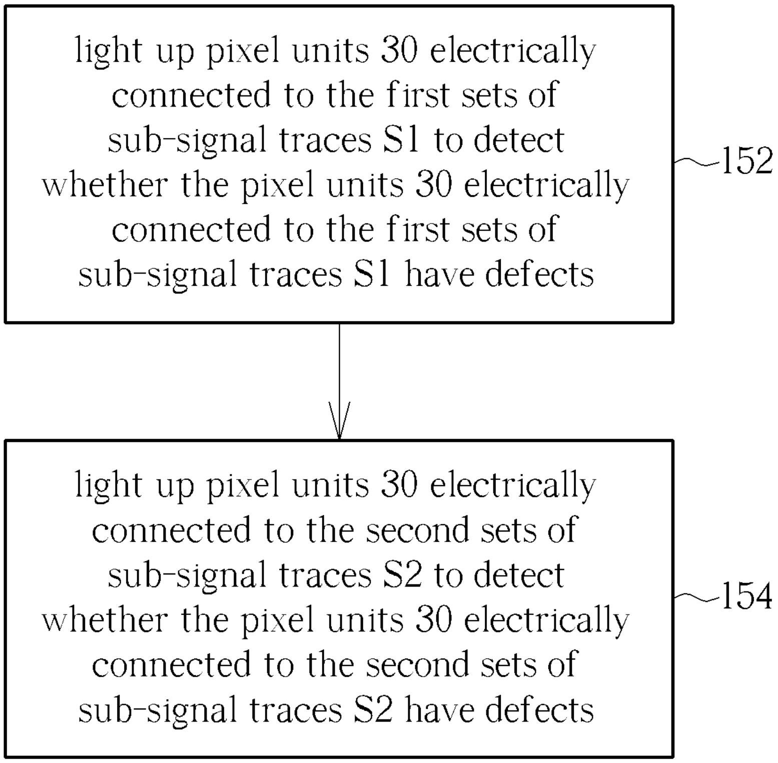
FIG. 4 is a flowchart of detecting defects of the display panel in FIG. 1.

Please refer to FIG. 4. FIG. 4 is a flowchart of detecting defects of the display 100 in FIG. 1. The descriptions of FIG. 4 are as follows:

Step 152: light up pixel units 30 electrically connected to the first sets of sub-signal lines S1 to detect whether the pixel units 30 electrically connected to the first sets of sub-signal lines S1 have defects; and Step 154: light up pixel units 30 electrically connected to the second sets of sub-signal lines S2 to detect whether the pixel units 30 electrically connected to the second sets of sub-signal lines S2 have defects.

In Steps 152 and 154, when lighting the pixel units 30 electrically connected to the first sets of sub-signal lines S1, the pixel units 30 electrically connected to the second sets of sub-signal lines S2 are not lighted, or can be lighted with low grey levels, to utilize the grey level difference to detect whether the pixel units 30 electrically connected to the first sets of sub-signal lines S1 have defects, e.g. bright spots or dark spots. For example, the test signal F2 inputted to the test pad D2 can be assigned to be no signal to make the pixel units 30 electrically connected to the second sets of sub-signal lines S2 not lighted, or the test signals F1, F2 inputted to the test pads D1, D2 can be assigned to be different from each other to make the brightness of the pixel units 30 electrically connected to the first sets of sub-signal lines S1 different from the brightness of those electrically connected to the second sets of sub-signal lines S2.

Figure 5:
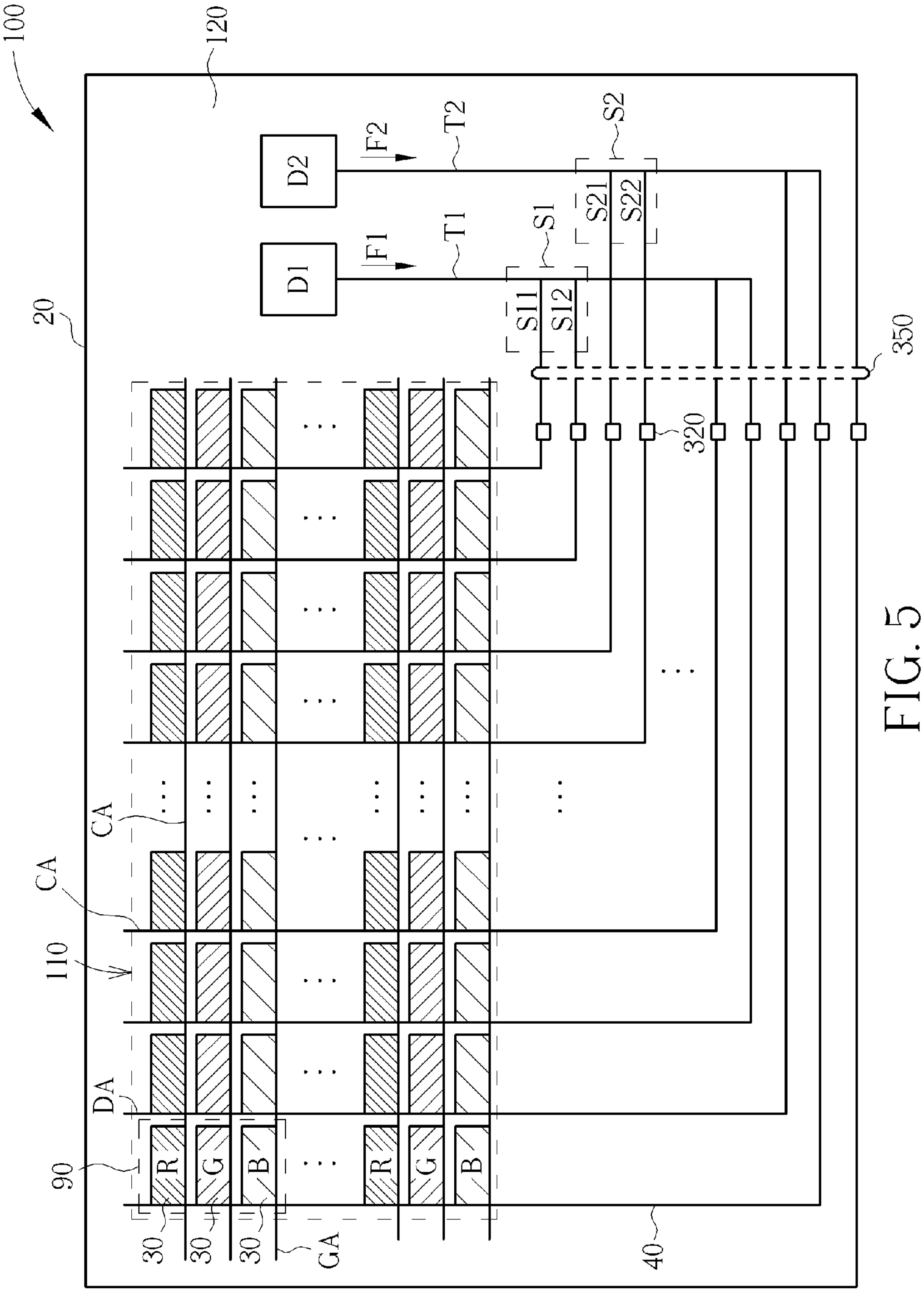
FIG. 5 shows configuring a cut trench in the display panel in FIG. 1.
Figure 6:
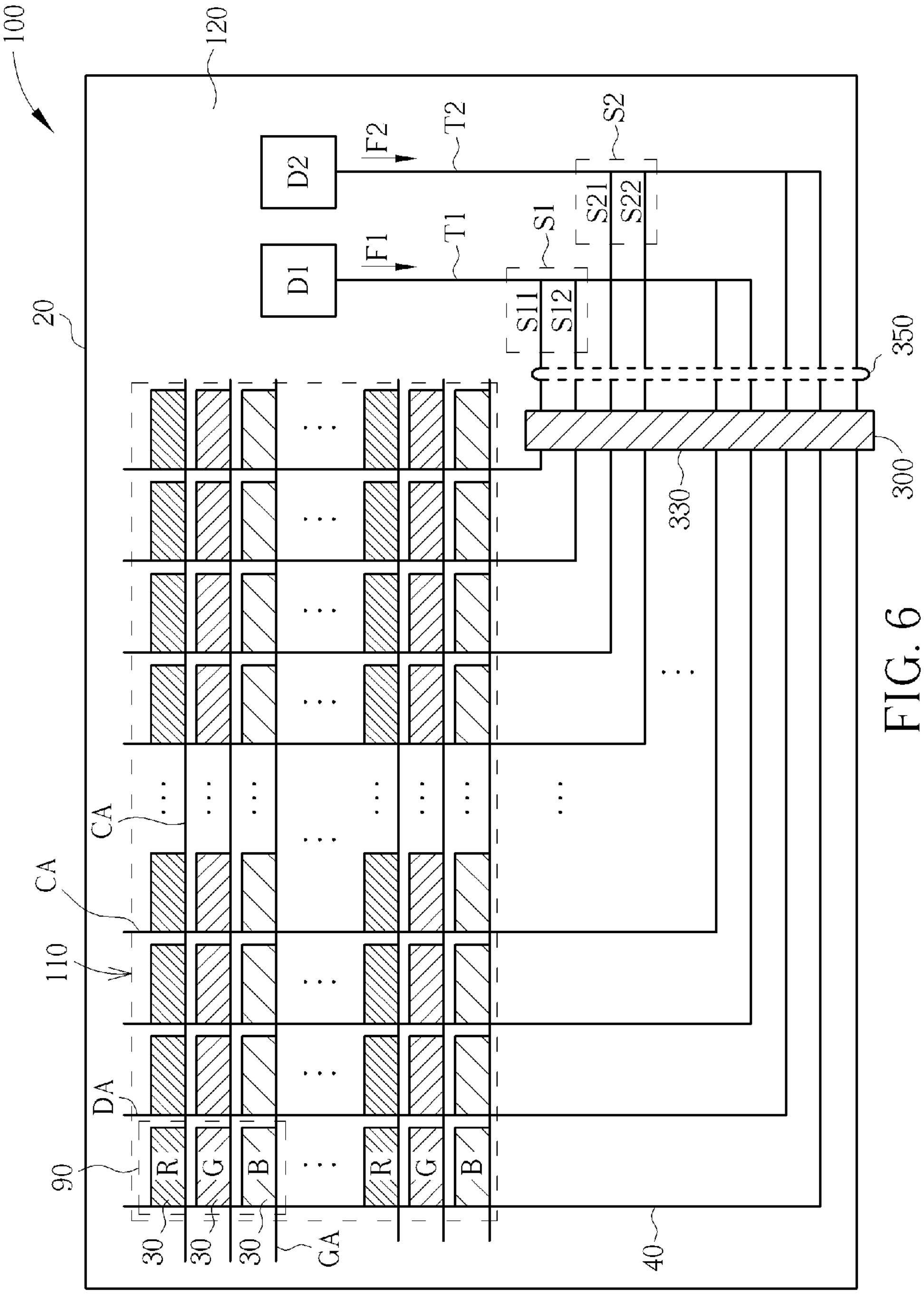
FIG. 6 shows configuring a driving element in the display panel in FIG. 1.

After performing the above testing procedures, only display panels passing the test can be configured with driving circuitries. Please refer to FIGS. 5 and 6. FIG. 5 shows configuring a cut trench 350 in the display panel 100 in FIG. 1. FIG. 6 shows configuring a driving element 300 in the display panel 100 in FIG. 1. As shown in FIG. 5, the cut trench 350 is disposed between the testing line T1 and the first sets of sub-signal lines S1 and between the testing line T2 and the second sets of sub-signal lines S2, to isolate the testing line T1 from the first sets of sub-signal lines S1, and to isolate the testing line T2 from the second sets of sub-signal lines S2. The cut trench 350 can be formed with the laser cutting technology. It can be seen from FIG. 5 that the first sets of sub-signal lines S1 and the second sets of sub-signal lines S2 are cut, and the cut positions are near the testing pads D1 and D2.

Please refer to FIG. 6, after isolating the testing lines T1 and T2, the driving element 300 is electrically connected to a plurality of first signal lines 40 for driving the pixel units 30. The driving element 300 can be an integrated circuit chip 330 disposed on the first signal lines 40 and electrically connected to the first signal lines 40. The driving element 300 can also be a chip on glass (COG), a chip on film (COF), a chip on board (COB), a tape automatic carrier bonding, a flexible printed circuit, and so on. Besides, as shown in FIG. 5, a plurality of connecting pads 320 can be configured on the first signal lines 40, so that each first signal line 40 is formed with at least one connecting pad 320. With the connecting pads 320, the driving element 300 can be more easily configured on the first signal line 40, strengthening the connection.

In the configuration of the first embodiment, two adjacent first sub-signal lines on the first conducting layer M1, such as S11 and S21, might be short circuited due to developing defects or conductive particles. If the first sub-signal lines S11, S21 are short circuited, when the testing signals F1, F2 inputted to the testing lines T1, T2 are different from one another, pixel units 30 coupled to the first sub-signal lines S11, S21 will unexpectedly emit the same brightness of light due to short circuit effect. Thus, the approach can effectively identify the short circuit defects of the first sub-signal lines S11 and S21 on the same layer. Similarly, the above method can be applied to detect whether two adjacent second sub-signal lines S12 and S22 on the second conducting layer M2 have defects. Compared with the present invention, the prior art display panel is configured to connect signal lines on the same conducting layers to the same testing line, thus the prior art is unable to detect short circuit defects of signal lines formed in the same layer. Besides, in the present embodiment, since the first sub-signal line S11 and the second sub-signal line S12 of the first set of sub-signal lines S1 are disposed on different layers, the aforementioned short circuit effects of the first sub-signal line S11 and the second sub-signal line S12 can be greatly reduced. Similarly, the short circuit effect in the second set of sub-signal line S2 can be greatly reduced as well. Therefore, with the first embodiment, even high resolution displays having high density signal lines can still be effectively detected, improving the yield rate and reducing the manufacturing cost.

Figure 7:
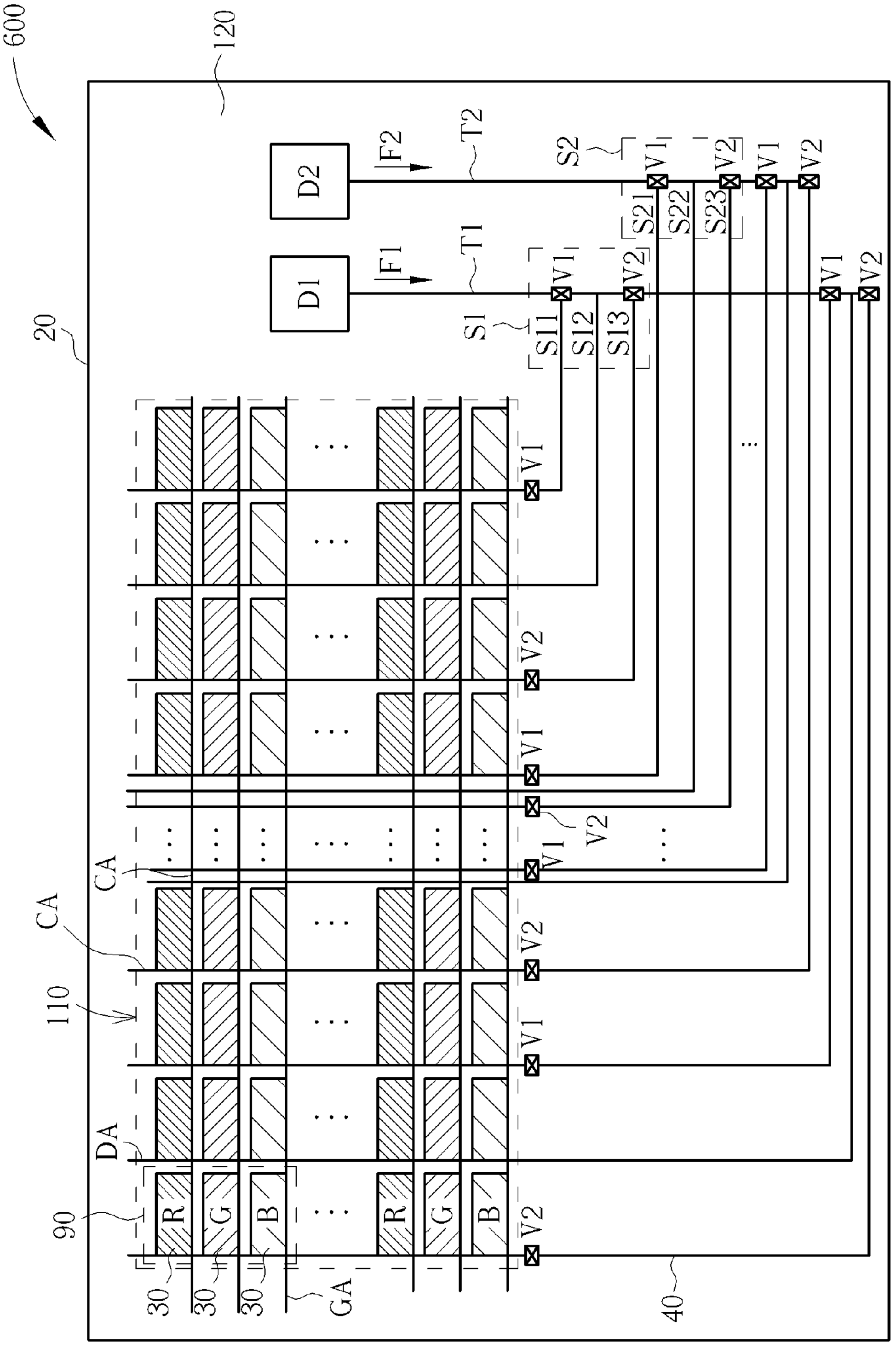
FIG. 7 shows a display panel according to the second embodiment of the present invention.

Please refer to FIG. 7, which shows a display panel 600 according to the second embodiment of the present invention. The difference between the display panels 600 and 100 is that, in the display panel 600, each first set of sub-signal lines S1 further comprises a third sub-signal line S13, and each second set of sub-signal lines S2 further comprises a third sub-signal line S23. The third sub-signal lines S13 and S23 can be formed on a third conducting layer. The first sub-signal line S11, the second sub-signal line S12 and the third sub-signal line S13 are formed on different layers in the peripheral area 120. The first sub-signal line S21, the second sub-signal line S22 and the third sub-signal line S23 are also formed on different layers in the peripheral area 120.

The first sub-signal line S21, second sub-signal line S22 and third sub-signal line S23 can be electrically connected to the pixel units 30 through data lines DA. According to another embodiment of the present invention, the data lines DA can be disposed on a layer different from the layers the first sub-signal line S21, second sub-signal line S22 and third sub-signal line S23 are disposed on. Besides, According to another embodiment of the present invention, all of the data lines DA can be disposed on the second conducting layer M2, and be electrically connected to first and third sub-signal lines 40 of different layers through the contact holes V1 and V2. For example, the first sub-signal line S21 is formed on the first conducting layer M1, the second sub-signal line S22 is formed on the second conducting layer M2, and the third sub-signal line S23 is formed on the third conducting layer M3. If the data lines DA are formed on the second conducting layer M2, the data lines DA can be electrically connected to the first sub-signal line S21 through the contact hole V1, electrically connected to the second sub-signal line S22 directly, and electrically connected to the third sub-signal line S23 through the contact hole V2.

Through the second embodiment, the first sub-signal lines S11, S21, the second sub-signal lines S12, S22 and the third sub-signal lines S13, S23 in the peripheral area 120 are formed on different layers, thus the adjacent first sub-signal line S11, the second sub-signal line S12 and the third sub-signal line S13 will not be short circuited to one another, because they are electrically connected to different conducting layers. Further, even if defects exist in the same layer, the defects can still be easily detected because two adjacent pixels in the same row are electrically connected to different testing lines T1 and T2, thus improving the yield rate of manufacturing the display panel 600.

Figure 8:
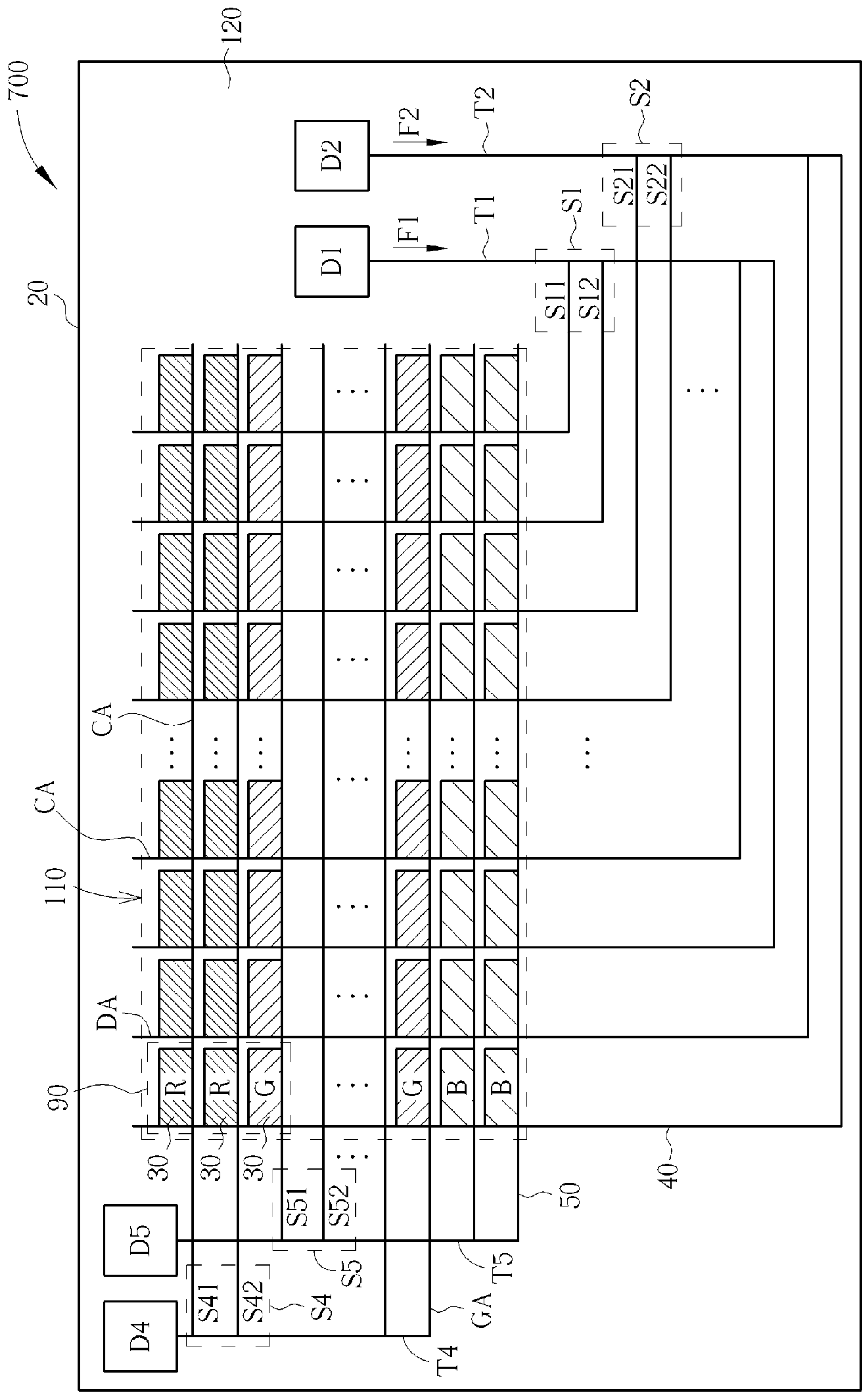
FIG. 8 shows a display panel according to the third embodiment of the present invention.

Please refer to FIG. 8. FIG. 8 shows a display panel 700 according to the third embodiment of the present invention. The difference between the third and first embodiments is that, in the third embodiment, the sub-pixels are not limited to be arranged in the sequence of " . . . , R, G, B, . . . " but can be adjusted according to users' needs. For example, the sub-pixels are arranged in the sequence of " . . . , R, R, G, G, B, B . . . . " Moreover, the direction of " . . . , R, G, B, . . . " or " . . . , R, R, G, G, B, B . . . " can be changed from vertical to horizontal, namely perpendicularly adjusting the arrangement.

Besides the testing pads D1 and D2, the display panel 700 further comprises a plurality of second signal lines 50, the testing lines T4 and T5, and the testing pads D4 and D5, to provide the pixel units 30 with the signals transmitted from testing pads D4 and D5. Further, the second signal lines 50 of the display panel 700 comprise fourth sets of sub-signal lines S4 and fifth sets of sub-signal lines S5. The fourth sets of sub-signal lines S4 and the fifth sets of sub-signal lines S5 are arranged alternatively. Each fourth set of sub-signal lines S4 comprises a fourth sub-signal line S41 and a fifth sub-signal line S42. Each fifth set of sub-signal lines S5 comprises a fourth sub-signal line S51 and a fifth sub-signal line S52. The fourth sub-signal lines S41, S51 and the fifth sub-signal lines S42, S52 are of different layers, but are all in the peripheral area 120. The testing line T4 is electrically connected to the fourth sub-signal lines S41 and the fifth sub-signal lines S42. The testing line T5 is electrically connected to the fourth sub-signal lines S51 and the fifth sub-signal lines S52. Similar to the first sub-signal lines S11 and the second sub-signal lines S12, the fourth sub-signal lines S41 and the fifth sub-signal lines S42 can be disposed on the first conducting layer M1 and the second conducting layer M2 respectively. The arrangement of the fourth sub-signal lines S51 and the fifth sub-signal lines S52 is similar to the arrangement of the fourth sub-signal lines S41 and the fifth sub-signal lines S42. The method of detecting the row sub-pixels can be implemented in the similar manner as detecting the column sub-pixels by providing the testing signals F1 and F2, and will not be further described.

Besides testing the column sub-pixels, the third embodiment further tests the row sub-pixels. Thus, in the third embodiment, the first sub-pixel lines S11, S21 and the second sub-pixel lines S12, S22 are disposed on different layers in the peripheral area 120, making the adjacent first sub-pixel line S11, S21 and the second sub-pixel line S12, S22 unable to be short circuited to one another. Similarly, the fourth sub-pixel lines S41, S51 and the fifth sub-pixel lines S42, S52 are disposed on different layers in the peripheral area 120, making the adjacent fourth sub-pixel line S41, S51 and the fifth sub-pixel line S42, S52 unable to be short circuited to one another. Moreover, if two adjacent sub-pixel lines in the same conducting layer are short circuited, the defects can be effectively detected for the adjacent sub-pixel lines are electrically connected to different testing lines. Thus, the yield rate of the display panel 700 can be improved.

Figure 9:
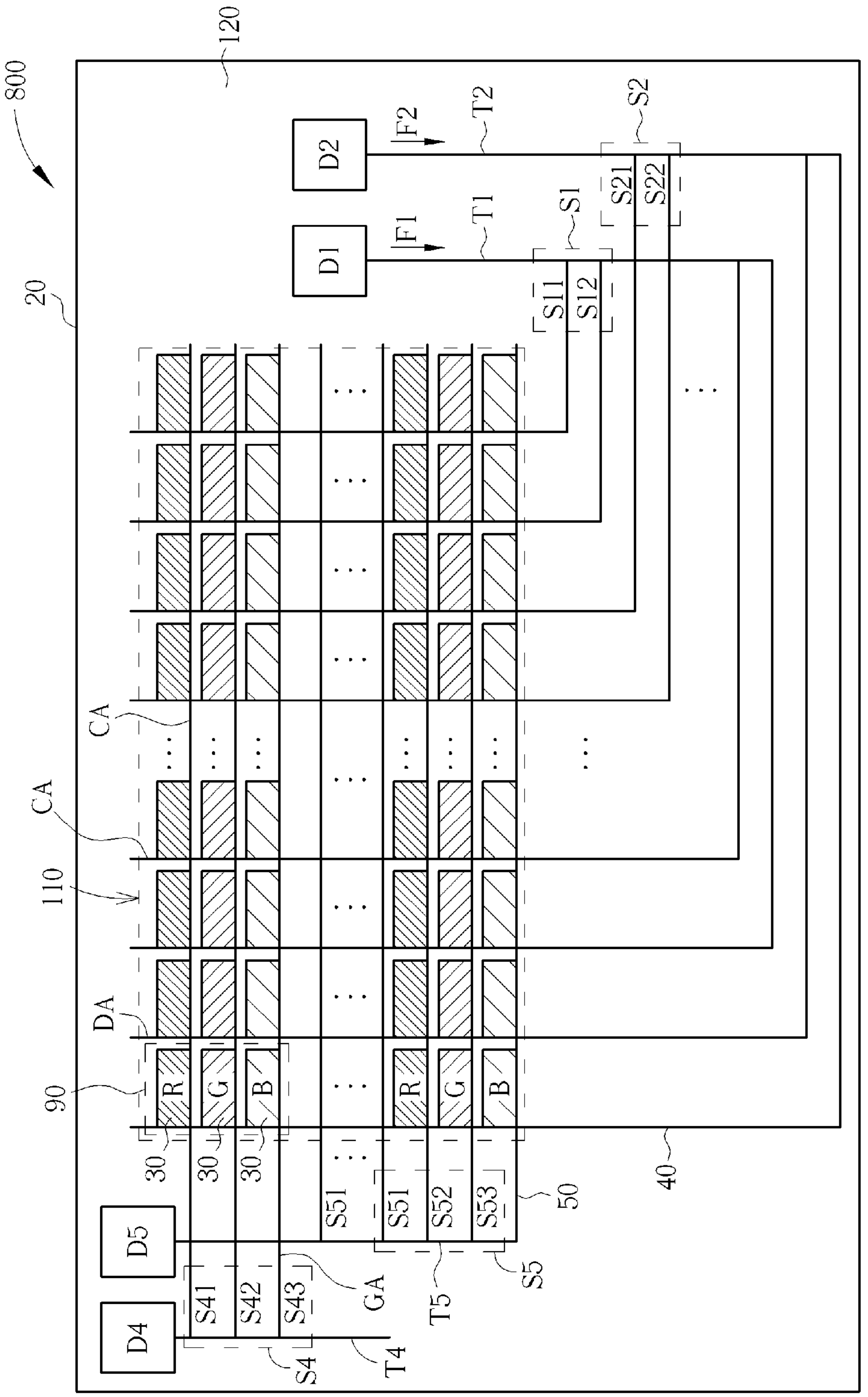
FIG. 9 shows a display panel according to the fourth embodiment of the present invention.

Please refer to FIG. 9. FIG. 9 shows a display panel 800 according to the fourth embodiment of the present invention. The difference between the fourth and third embodiments is that, in the fourth embodiment, each fourth set of sub-pixel lines S4 further comprises a sixth sub-pixel line S43, and each fifth set of sub-pixel lines S5 further comprises a sixth sub-pixel line S53. The fourth sub-pixel lines S41, S51, the fifth sub-pixel lines S42, S52 and the sixth sub-pixel lines S43, S53 are disposed in the peripheral area 120. The fourth sub-pixel lines S41, S51, the fifth sub-pixel lines S42, S52 and the sixth sub-pixel lines S43 and S53 are formed on different layers. The testing line T4 is electrically connected to the fourth sub-pixel line S41, the fifth sub-pixel line S42 and the sixth sub-pixel line S43. The testing line T5 is electrically connected to the fourth sub-pixel line S51, the fifth sub-pixel line S52 and the sixth sub-pixel line S53.

The sixth sub-pixel lines S43, S53 can be disposed on a third conducting layer. Similar to that the first sub-pixel lines S11, S21 and the second sub-pixel lines S12, S22 are disposed on conducting layers M1 and M2 respectively, the fourth sub-pixel lines S41, S51, the fifth sub-pixel lines S42, S52 and the sixth sub-pixel lines S43, S53 can be disposed on three different conducting layers. Moreover, according to another embodiment of the present invention, the "R, G, B" arrangement of the sub-pixels can be changed from vertical to horizontal. In a modified embodiment of the present invention, the data lines DA and the gate lines GA can be exchanged according to design requirements. It is well known by a person skilled in the art and will not be described in detail herein.

In the fourth embodiment, the first sub-pixel lines S11, S21 and the second sub-pixel lines S12, S22 are disposed on different layers in the peripheral area 120, making the adjacent first sub-pixel line S11, S21 and the second sub-pixel line S12, S22 unable to be short circuited to one another. Similarly, the fourth sub-pixel lines S41, S51, the fifth sub-pixel lines S42, S52 and the sixth sub-pixel lines S43, S53 are disposed on different layers in the peripheral area 120, making the adjacent fourth sub-pixel line S41, S51, the fifth sub-pixel lines S42, S52 and the sixth sub-pixel lines S43, S53 unable to be short circuited to one another. Moreover, if two adjacent sub-pixel lines in the same conducting layer are short circuited, the defects can be effectively detected for the adjacent sub-pixel lines are electrically connected to different testing lines. Thus, the yield rate of the display panel 800 can be improved.

In view of above, with the configuration of the first signal lines 40 and the second signal lines 50, the defects of display panels can be effectively detected to improve the yield rate of the display panels.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display panel, comprising:

a first substrate having a display area and a peripheral area;

a plurality of pixel units, arranged on the display area in an array;

a plurality of first signal lines, disposed on the peripheral area and electrically connected to corresponding pixel units, the plurality of first signal lines comprising a plurality of first sets of sub-signal lines and a plurality of second sets of sub-signal lines alternatively arranged, each first set of sub-signal lines having a first sub-signal line and a second sub-signal line, each second set of sub-signal lines having the first sub-signal line and the second sub-signal line, first sub-signal lines of the first sets of sub-signal lines and of the second sets of sub-signal lines and second sub-signal lines of the first sets of sub-signal lines and of the second sets of sub-signal lines being formed on different layers;

a first testing line, electrically connected to the first and second sub-signal lines of the first sets of sub-signal lines; and a second testing line, electrically connected to the first and second sub-signal lines of the second sets of sub-signal lines.

2. The display panel of claim 1, wherein the first and second sub-signal lines of the first sets of sub-signal lines and of the second sets of sub-signal lines are alternatively arranged.

3. The display panel of claim 1, wherein the first sub-signal lines of the first sets of sub-signal lines and of the second sets of sub-signal lines are formed by a first conducting layer, and the second sub-signal lines of the first sets of sub-signal lines and of the second sets of sub-signal lines are formed by a second conducting layer.

4. The display panel of claim 3, wherein the first sub-signal lines of the first sets of sub-signal lines and of the second sets of sub-signal lines are electrically connected to respective pixel units through respective contact holes, and the second sub-signal lines of the first sets of sub-signal lines and of the second sets of sub-signal lines are electrically connected to respective pixel units directly.

5. The display panel of claim 1, further comprising a first dielectric layer formed on the first substrate, and formed between the first sub-signal lines of the first sets of sub-signal lines and of the second sets of sub-signal lines and the second sub-signal lines of the first sets of sub-signal lines and of the second sets of sub-signal lines.

6. The display panel of claim 5, further comprising a second dielectric layer formed above the first substrate, overlaying the second sub-signal lines of the first sets of sub-signal lines and of the second sets of sub-signal lines and the first dielectric layer.

7. The display panel of claim 1, further comprising a second substrate and a display medium layer formed between the first and second substrates.

8. The display panel of claim 1, further comprising:

a first testing pad electrically connected to the first testing line; and a second testing pad electrically connected to the second testing line.

9. The display panel of claim 1, wherein each of the first and second sets of sub-signal lines further comprises a third signal line, and the first, second and third sub-signal lines of the first and second sets of sub-signal lines are formed on different layers.

10. The display panel of claim 9, wherein the third sub-signal lines of the first and second sets of sub-signal lines are formed by a third conducting layer.

11. The display panel of claim 1, further comprising:

a plurality of second signal lines disposed on the peripheral area and electrically connected to corresponding pixel units, the second signal lines comprising a plurality of fourth sets of sub-signal lines and a plurality of fifth sets of sub-signal lines alternatively arranged, each fourth set of sub-signal lines having a fourth sub-signal line and a fifth sub-signal line, each fifth set of sub-signal lines having a fourth sub-signal line and a fifth sub-signal line, fourth sub-signal lines of the fourth sets of sub-signal lines and of the fifth sets of sub-signal lines and the fifth sub-signal lines of the fourth sets of sub-signal lines and of the fifth sets of sub-signal lines being on different layers;

a fourth testing line, electrically connected to the fourth and fifth sub-signal lines of the fourth sets of sub-signal lines; and a fifth testing line, electrically connected to the fourth and fifth sub-signal lines of the fifth sets of sub-signal lines.

12. The display panel of claim 11, wherein the plurality of first signal lines are a plurality of data lines, and the plurality of second signal lines are a plurality of scan lines.

13. The display panel of claim 11, wherein the fourth and fifth sub-signal lines of the fourth sets of sub-signal lines and of the fifth sets of sub-signal lines are alternatively arranged.

14. The display panel of claim 11, wherein the fourth sub-signal lines of the fourth sets of sub-signal lines and of the fifth sets of sub-signal lines are formed by a first conducting layer, and the fifth sub-signal lines of the fourth sets of sub-signal lines and of the fifth sets of sub-signal lines are formed by a second conducting layer.

15. The display panel of claim 11, wherein each of the fourth and fifth sets of sub-signal lines further comprises a sixth signal line.

16. A method of detecting defects of a display panel, the display panel comprising a first substrate, a plurality of pixel units, a plurality of first signal lines, a first testing line and a second testing line, the first substrate having a display area and a peripheral area, the plurality of pixel units being arranged on the display area in an array, the plurality of first signal lines being disposed on the peripheral area and electrically connected to corresponding pixel units, the plurality of first signal lines comprising a plurality of first sets of sub-signal lines and a plurality of second sets of sub-signal lines alternatively arranged, each first set of sub-signal lines having a first sub-signal line and a second sub-signal line, each second set of sub-signal lines having a first sub-signal line and a second sub-signal line, first sub-signal lines of the first sets of sub-signal lines and of the second sets of sub-signal lines and second sub-signal lines of the first sets of sub-signal lines and of the second sets of sub-signal lines being formed on different layers, the first testing line being electrically connected to the first and second sub-signal lines of the first sets of sub-signal lines, the second testing line being electrically connected to the first and second sub-signal lines of the second sets of sub-signal lines, the method comprising:

lighting up pixel units electrically connected to the first sets of sub-signal lines to detect whether the pixel units electrically connected to the first sets of sub-signal lines have defects; and lighting up pixel units electrically connected to the second sets of sub-signal lines to detect whether the pixel units electrically connected to the second sets of sub-signal lines have defects.

17. The method of claim 16, wherein lighting up the pixel units electrically connected to the first sets of sub-signal lines comprises inputting a first set of testing signals to the first and second testing lines.

18. The method of claim 16, wherein lighting up the pixel units electrically connected to the second sets of sub-signal lines comprises inputting a second set of testing signals to the first and second testing lines.

19. A display panel, comprising:

a first substrate having a display area and a peripheral area;

a plurality of pixel units, arranged on the display area in an array;

a plurality of first signal lines, disposed on the peripheral area and electrically connected to corresponding pixel units, the plurality of first signal lines comprising a plurality of first sets of sub-signal lines and a plurality of second sets of sub-signal lines alternatively arranged, each first set of sub-signal lines having a first sub-signal line and a second sub-signal line, each second set of sub-signal lines having a first sub-signal line and a second sub-signal line, first sub-signal lines of the first sets of sub-signal lines and of the second sets of sub-signal lines and second sub-signal lines of the first sets of sub-signal lines and of the second sets of sub-signal lines being formed on different layers;

a driving element, disposed on the first signal lines and electrically connected to the first signal lines;

a first testing line, disposed corresponding to the first and second sub-signal lines of the first sets of sub-signal lines;

a second testing line, disposed corresponding to the first and second sub-signal lines of the second sets of sub-signal lines; and a slit, formed between the first testing line and the first sets of sub-signal lines, and between the second testing line and the second sets of sub-signal lines, for isolating the first testing line from the first sets of sub-signal lines, and isolating the second testing line from the second sets of sub-signal lines.

20. The display panel of claim 19, wherein the driving element comprises an integrated circuit chip.

21. The display panel of claim 19, wherein the first signal lines further comprises a plurality of connecting pads for electrically connecting the driving element.

* * * * *